(12) United States Patent
Black et al.

(10) Patent No.: US 11,355,690 B2
(45) Date of Patent: Jun. 7, 2022

(54) SUPERCONDUCTING QUBIT DEVICES BASED ON METAL SILICIDES

(71) Applicant: Brookhaven Science Associates, LLC, Upton, NY (US)

(72) Inventors: Charles T. Black, New York, NY (US); Mingzhao Liu, Syosset, NY (US)

(73) Assignee: Brookhaven Science Associates, LLC, Upton, NY (US)

( * ) Notice: Subject to any disclaimer, the term of this patent is extended or adjusted under 35 U.S.C. 154(b) by 277 days.

(21) Appl. No.: 16/811,278

(22) Filed: Mar. 6, 2020

(65) Prior Publication Data

US 2020/0287119 A1   Sep. 10, 2020

Related U.S. Application Data

(60) Provisional application No. 62/815,756, filed on Mar. 8, 2019.

(51) Int. Cl.
| | |
|---|---|
| *H01L 39/22* | (2006.01) |
| *H01L 39/24* | (2006.01) |
| *B82Y 40/00* | (2011.01) |
| *G06N 10/00* | (2022.01) |

(Continued)

(52) U.S. Cl.
CPC ............ *H01L 39/223* (2013.01); *B82Y 10/00* (2013.01); *B82Y 40/00* (2013.01); *G06N 10/00* (2019.01); *H01L 39/025* (2013.01); *H01L 39/2493* (2013.01)

(58) Field of Classification Search
CPC . H01L 39/223; H01L 39/025; H01L 39/2493; B82Y 10/00; B82Y 40/00; G06N 10/00
See application file for complete search history.

(56) References Cited

U.S. PATENT DOCUMENTS

| | | | |
|---|---|---|---|
| 4,230,523 A | 10/1980 | Gajda | |
| 8,301,214 B1 * | 10/2012 | Tolpygo | ................ H01L 39/223 505/190 |
| 9,997,606 B2 | 6/2018 | Cheng et al. | |

(Continued)

OTHER PUBLICATIONS

Roberts, B.W., "Survey of superconductive materials and critical evaluation of selected properties", Journal of Physical and Chemical Reference Data 5, 581 (1976).

(Continued)

*Primary Examiner* — Matthew L Reames
(74) *Attorney, Agent, or Firm* — Dorene M. Price

(57) ABSTRACT

A qubit device for use in a quantum computing environment includes a semiconductor substrate, an insulating layer disposed on at least a portion of an upper surface of the substrate, and a transition metal silicide (TMSi) heterojunction disposed on at least a portion of an upper surface of the insulating layer. The TMSi heterojunction includes a link layer and at least first and second TMSi regions coupled with the link layer. The link layer may include a normal conductor, thereby forming a superconductor-normal conductor-superconductor (SNS) junction, or a geometric constriction, thereby forming a superconductor-geometric constriction-superconductor (ScS) junction. The link layer may form at least a portion of a channel including intrinsic or doped silicon.

20 Claims, 3 Drawing Sheets

(51) Int. Cl.
*B82Y 10/00* (2011.01)
*H01L 39/02* (2006.01)

(56) References Cited

U.S. PATENT DOCUMENTS 10,177,297 B2  1/2019  Marcus et al.
2010/0155880 A1  6/2010  Ban et al.

OTHER PUBLICATIONS

Tu, K. N., et al., Formation of vanadium silicides by the interactions of V with bare and oxidized Si wafers*, Appl. Phy $. Lett., vol. 23, No. 9, 1 (1973).
Hardy G. F., et al., "Superconducting Silicides and Germanides", Phys. Rev. 89, 884 (1953).
Zur, A., et al., "Transition-metal silcides lattice-matched to silicon", J. Appl. Phys. 57 (2), (1985).
Liu, J., et al., "Fabrication and measurement of graphene p-n junction with two top gates", Electronics Letters, 6th vol. 50 No. 23 pp. 1724-1726 (2014).
Prest, M. J., et al., "Superconducting platinum silicide for electron cooling in silicon", https://arxiv.org/abs/1405.4119 (online access Mar. 6, 2020).

* cited by examiner

SUPERCONDUCTING QUBIT DEVICES BASED ON METAL SILICIDES

CROSS-REFERENCE TO RELATED APPLICATIONS

This application claims the benefit of U.S. Provisional Patent Application No. 62/815,756, filed on Mar. 8, 2019, entitled "Superconducting Qubit Devices Based on Metal Silicides," which is hereby incorporated by reference herein in its entirety for all purposes.

STATEMENT OF GOVERNMENT RIGHTS

The present application was made with government support under contract number DE-SC0012704 awarded by the United States Department of Energy. The United States government has certain rights in the invention(s).

BACKGROUND

The present invention relates generally to the electrical, electronic and computer arts, and, more particularly, to Josephson junctions and their applications in the field of superconducting solid-state electronic circuits.

As is well known, if you cool many metals and alloys to very low temperatures (e.g., within 20 degrees or so of absolute zero), a phase transition occurs. At this "critical temperature," the metal transitions from what is considered a normal state, where it has electrical resistance, to a superconducting state, where there is essentially no resistance to the flow of direct electrical current. What occurs is that the electrons in the metal become paired; above the critical temperature, the net interaction between two electrons is repulsive, but below the critical temperature, the overall interaction between two electrons becomes slightly attractive, a result of an interaction between the electrons and the ionic lattice of the metal. This very slight attraction allows the electrons to drop into a lower energy state, opening up an energy gap. Because of the energy gap and the lower energy state, electrons can move freely without being scattered by the ions of the lattice.

It is to be understood that the term "metal" is used above from a physics perspective to refer to those elements having a partially filled conduction band and having lower resistance toward lower temperature. Thus, a superconducting metal silicide would also be considered a metal.

A Josephson junction is a quantum mechanical device which is comprised of two superconducting electrodes separated by a thin barrier (e.g., insulating tunnel barrier, non-superconducting metal, semiconductor, ferromagnet, etc.). The devices are named after Brian Josephson, who predicted in 1962 that pairs of superconducting electrons could essentially "tunnel" through the non-superconducting barrier from one superconductor to another. Electronic circuits can be built from Josephson junctions, especially digital logic circuitry. Many researchers are working on building ultrafast computers using Josephson logic.

Superconducting solid-state electronic circuits based on Josephson-effect nonlinear oscillators may be used in qubit implementations for quantum computing. Aluminum may be the desired superconductor despite having a relatively low superconducting transition temperature (TC) (e.g., about 1.2 degrees Kelvin) and narrow superconducting energy gap (e.g., about 44 gigahertz (GHz)). A transmon is a type of superconducting charge qubit that was designed to have reduced sensitivity to charge noise. A transmon device architecture implemented using aluminum (Al)/aluminum oxide (AlOx)/Al junctions, has been studied and is the basis of current qubit technology. However, conventional transmon implementations have limited prospects for scaling. Moreover, achieving high quality superconductor-silicon interfaces, and identifying compatible superconductors with higher TC and other tunable attributes, remains a challenge.

SUMMARY

The present invention, as manifested in one or more embodiments, beneficially provides a method for fabricating superconducting transition metal silicide (TMSi) structures suitable for use as qubit devices in a quantum computing application. In one or more embodiments, a TMSi structure is formed as a thin film disposed on an oxide layer (for example in a silicon-on-insulator (SOI) wafer). The oxide layer may be, for example, a silicon dioxide ($SiO_2$) layer.

In one or more embodiments, the novel TMSi structures are integrated into superconducting qubit devices. In accordance with embodiments of the invention, there may be two parts of the superconducting qubit devices based on metal silicides. A first part may involve thermal diffusion of a metal (e.g., by thermal annealing) into a silicon device layer of a silicon-on-insulator (SOI) wafer. The silicon dioxide layer may be disposed atop or directly atop a substrate. The top layer of the wafer may be a silicon device layer.

In accordance with an embodiment of the invention, a superconducting qubit structure includes a semiconductor substrate, an insulating layer disposed on at least a portion of an upper surface of the substrate, and a TMSi heterojunction disposed on at least a portion of an upper surface of the insulating layer. The TMSi heterojunction includes a link layer and at least first and second TMSi regions coupled with the link layer. The link layer may include a normal conductor, thereby forming a superconductor-normal conductor-superconductor (SNS) junction, or a geometric constriction, thereby forming a superconductor-geometric constriction-superconductor (ScS) junction. The link layer may form at least a portion of a channel including intrinsic or doped silicon.

In accordance with an embodiment of the invention, a method of forming a qubit structure for use in a quantum computing environment includes: forming an insulating layer on at least a portion of an upper surface of a semiconductor substrate; and forming a transition metal silicide (TMSi) heterojunction on at least a portion of an upper surface of the insulating layer, the TMSi heterojunction including a link layer and at least first and second TMSi regions coupled with the link layer.

As may be used herein, "facilitating" an action includes performing the action, making the action easier, helping to carry the action out, or causing the action to be performed. Thus, by way of example only and without limitation, in the context of a semiconductor fabrication methodology, steps performed by one entity might facilitate an action carried out by another entity to cause or aid the desired action(s) to be performed. For the avoidance of doubt, where an actor facilitates an action by other than performing the action, the action is nevertheless performed by some entity or combination of entities.

Techniques of the present invention can provide substantial beneficial technical effects. By way of example only and without limitation, TMSi structures and/or methods of fabricating TMSi structures according to embodiments of the invention may provide one or more of the following advantages:

use of TMSi superconductors for qubit devices;
use and conversion of SOI wafer for the fabrication of TMSi structures;
use of TMSi/silicon/TMSi heterojunctions as Josephson junctions;
provides lattice-matched, atomically smooth interface between superconducting TMSi structure and silicon semiconductor;
allows the use of gate voltage to tune a Cooper pair transport across a silicon weak link separating the TMSi superconductor on either side (In condensed matter physics, a Cooper pair is a pair of electrons (or other fermions) bound together at low temperatures in a prescribed manner);
use of horizontal TMSi/silicon interface to achieve high critical current across Josephson junction.

These and other features and advantages of the present invention will become apparent from the following detailed description of illustrative embodiments thereof, which is to be read in connection with the accompanying drawings.

BRIEF DESCRIPTION OF THE DRAWINGS

Non-limiting and non-exhaustive embodiments of the present invention will be described with reference to the following drawings which are presented by way of example only, wherein like reference numerals (when used) indicate corresponding elements throughout the several views unless otherwise specified, and wherein.

Figure 1:
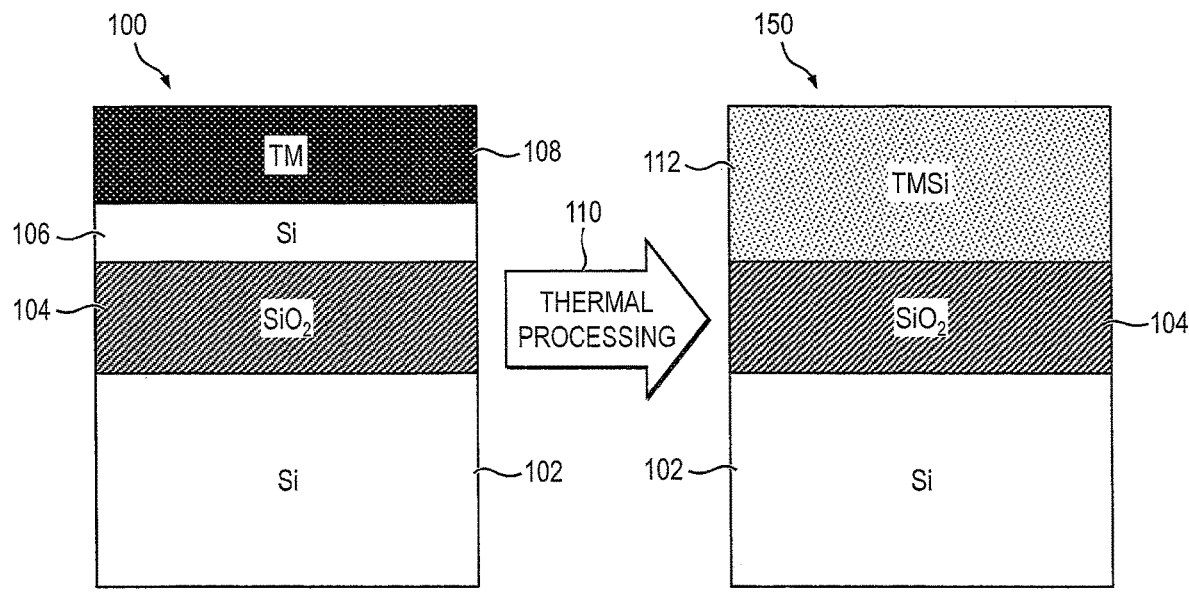
FIG. 1 conceptually illustrates an exemplary transition metal silicide (TMSi) thin film fabrication process by metal-silicon thermal diffusion over a silicon-on-insulator (SOI) wafer.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention, as manifested in one or more embodiments thereof, will be described herein in the context of illustrative transition metal silicide (TMSi) structures, and methods for fabricating such structures, which have beneficial application, for example, as qubits in a quantum computing environment. It is to be appreciated, however, that the invention is not limited to the specific structures and/or methods illustratively shown and described herein. Rather, it will become apparent to those skilled in the art given the teachings herein that numerous modifications can be made to the embodiments shown that are within the scope of the claimed invention. That is, no limitations with respect to the embodiments shown and described herein are intended or should be inferred.

As previously stated, in a quantum computing environment, superconducting solid-state electronic circuits and/or devices based on Josephson-effect nonlinear oscillators may be used in qubit implementations. However, conventional transmon implementations, which may form the basis of qubit technology, generally have limited prospects for scaling. Moreover, achieving high-quality superconductor-silicon interfaces, and identifying compatible superconductors with higher superconducting transition temperature ($T_C$) and other tunable attributes, remains a challenge.

In order to overcome one or more disadvantages exhibited by conventional qubit device implementations, the present invention, as manifested in one or more embodiments, relates to novel superconducting qubit device structures based on superconducting transition metal silicides. By way of illustration only and without limitation, one or more of the accompanying figures depict exemplary processing steps/stages in the fabrication of a superconducting qubit device structure according to embodiments of the invention.

Although the overall fabrication method and the structures formed thereby are entirely novel, certain individual processing steps required to implement the method may utilize conventional semiconductor fabrication techniques and conventional semiconductor fabrication tooling. These techniques and tooling will already be familiar to those having ordinary skill in the relevant arts given the teachings herein. Moreover, many of the processing steps and tooling used to fabricate semiconductor devices are also described in a number of readily available publications, including, for example: P. H. Holloway et al., *Handbook of Compound Semiconductors: Growth, Processing, Characterization, and Devices*, Cambridge University Press, 2008; and R. K. Willardson et al., *Processing and Properties of Compound Semiconductors*, Academic Press, 2001, which are both hereby incorporated herein by reference in their entireties for all purposes. It is emphasized that while some individual processing steps are set forth herein, those steps are merely illustrative, and one skilled in the art may be familiar with several equally suitable alternatives that would also fall within the scope of the invention.

It is to be appreciated that the various layers and/or regions shown in the accompanying figures may not be drawn to scale. Furthermore, one or more semiconductor layers of a type commonly used in such semiconductor devices may not be explicitly shown in a given figure to facilitate a clearer description. This does not imply that the semiconductor layer(s) not explicitly shown are omitted in the actual device.

FIG. 1 conceptually illustrates an exemplary transition metal silicide thin film fabrication process by metal-silicon thermal diffusion over a silicon-on-insulator (SOI) wafer. Specifically, the transition metal silicide thin film fabrication process involves forming a structure 100 which includes a substrate 102, which may comprise doped or undoped crystalline silicon (Si), an insulating layer 104 disposed on at least a portion of an upper surface of the substrate 102, and a silicon layer 106 disposed on at least a portion of an upper surface of the insulating layer 104. The insulating layer 104, which may comprise silicon dioxide ($SiO_2$) or an alternative dielectric or oxide material, in conjunction with the silicon layer 106 may, in one or more embodiments, form at least a portion of an SOI wafer; the silicon layer 106 may be a device layer of an SOI wafer. The structure 100 further includes a metal layer 108, which preferably comprises a transition metal, disposed on at least a portion of an upper surface of the silicon layer 106.

Figure 3:
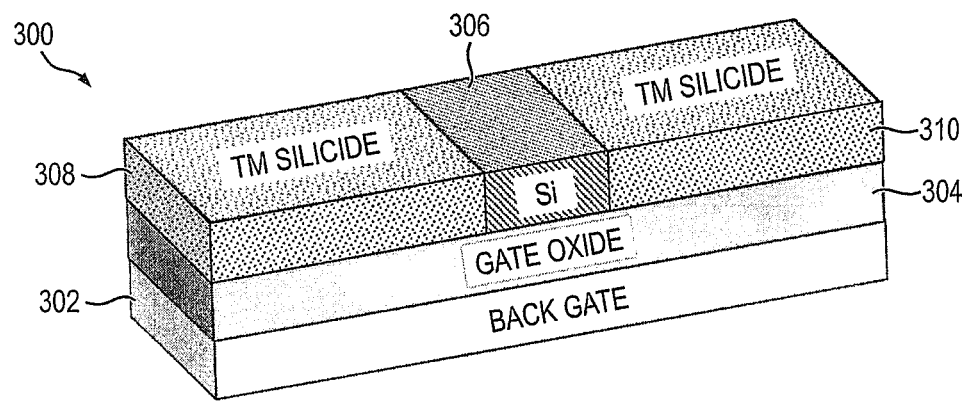
FIG. 3 is a perspective view depicting an exemplary device structure for a transition metal silicide/semiconductor/transition metal silicide Josephson junction with a vertical interface, according to an embodiment of the present invention.
Figure 4:
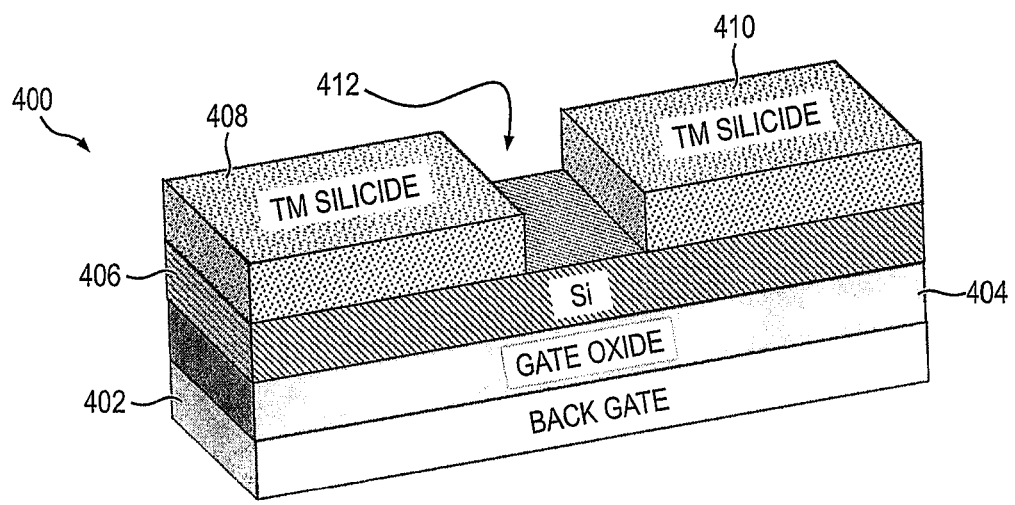
FIG. 4 is a perspective view depicting an exemplary device structure for a transition metal silicide/semiconductor/transition metal silicide Josephson junction with a horizontal interface, according to an embodiment of the present invention.

The substrate 102 may be a base silicon substrate which, in one or more embodiments, comprises a back gate region (e.g., 302 in FIG. 3 or 402 in FIG. 4). Although embodiments of the invention are not limited to any particular dimensions for the respective layers, the substrate 102 may be thicker than the other layers disposed, directly or indirectly, on the substrate (e.g., insulating layer 104, silicon layer 106 and metal layer 108). The substrate 102 may comprise a single crystalline semiconductor material such as silicon (and may therefore be referred to as a silicon wafer), or the substrate may comprise alternate materials, which may or may not be combined with silicon. Alternate materials suitable for use as a substrate include, but are not limited to, germanium, indium antimonide, lead telluride, indium arsenide, indium phosphide, gallium arsenide, gallium antimonide, indium gallium arsenide, aluminum gallium indium phosphide, etc. Although a few examples of suitable materials from which the substrate 102 may be formed are described herein, any material that may serve as a foundation upon which a superconductor qubit device can be built similarly falls within the spirit and scope of the present silicide-based qubit device.

The insulating layer 104 disposed on the substrate 102 may, in one or more embodiments, be grown or deposited on the upper surface of the substrate. In the case of a silicon substrate 102, for example, the insulating layer 104 formed is silicon dioxide; the silicon dioxide may form a layer disposed atop the silicon substrate of the SOI wafer. Alternate oxides may be grown (e.g., using an epitaxial growth process) or deposited (e.g., using chemical vapor deposition (CVD), plasma-enhanced chemical vapor deposition (PECVD), etc.); deposition is preferably used in cases where the substrate includes materials other than silicon. The insulating layer 104 may be grown to a thickness of between about 10 Angstroms (Å) and 500 (Å), more preferably between about 25 (Å) and 250 (Å), in one or more embodiments. Methods of growing or depositing an insulating layer on a semiconductor substrate are well known, as will become apparent to those skilled in the art.

The metal layer 108 preferably comprises a transition metal, such as, but not limited to, titanium, tantalum, platinum, cobalt, nickel, tungsten, or alloys thereof. In one or more embodiments, the metal layer preferably comprises a superconducting metal, such as, for example, vanadium, aluminum or barium. The metal layer 108 is preferably deposited on the upper surface of the silicon layer 106 using a standard deposition process (e.g., PECVD, CVD, sputtering, etc.).

Once the metal layer 108 is formed on the silicon layer 106, the structure 100 is subjected to thermal processing 110, such as annealing (e.g., rapid thermal anneal (RTA)) or the like, to form a silicide layer 112 in the resulting structure 150. As will be known by those skilled in the art, the silicide formation technique involves directly depositing a refractory metal on a silicon surface to form the required silicide layer through a process of direct metallurgical reaction. After the metal is deposited on the silicon, the structure is exposed to high temperatures (e.g., about 200-1000 degrees Celsius) that promote chemical reactions between the metal and the silicon needed to form the silicide.

In such a metallurgical reaction, metal-rich silicides generally form first, and continue to grow until all the metal is consumed. When the metal has been consumed, silicides of lower metal content start appearing, which can continue to grow simply by consuming the metal-rich silicides. Silicide formation by direct metallurgical reaction consumes silicon from the silicon layer 106 onto which the metal layer 108 was placed. A treatment of thermal annealing may be conducted at prescribed temperatures, for prescribed durations of time, under a prescribed gas or gas mixture, and other parameters sufficient to render thermal diffusion of the metal into the underlying silicon layer of the SOI wafer. The temperature used for thermal annealing is typically a function of the type of metal employed, and generally ranges from about 200 to 800 degrees Celsius, depending on the melting point of the metal.

In other embodiments of the invention, the silicide layer 112 can be formed using alternative technologies known by those skilled in the art, such as, for example, co-evaporation, sputtering, chemical vapor deposition, or epitaxial growth. Co-evaporation involves the simultaneous deposition of metal and silicon under high-vacuum conditions. The metal and silicon are vaporized through one of several possible heating techniques (e.g., by an electron beam, radio frequency (RF) induction, laser, or resistive heating). Sputtering is a deposition process whereby atoms or molecules are ejected from a target material by high-energy particle bombardment so that the ejected atoms or molecules condense on the surface of a substrate as a thin film. Sputtering of silicides comes in various forms, including sputtering from two targets using multi-pass sputtering systems to achieve a prescribed mixture of metal and silicon in a layered structure. Sintering then completes the chemical reaction between the metal and silicon to form the silicide. Chemical vapor deposition of silicide involves chemical reactions between vapors to form a silicide film. Epitaxially grown silicides belong to a special class of silicides that exhibit a definite orientation relationship with respect to the underlying silicon layer. A silicide is expected to grow epitaxially on silicon if the crystal structures are similar and the lattice mismatch between them is small. For example, nickel silicide ($NiSi_2$) and cobalt silicide ($CoSi_2$) can be grown in single-crystal form on silicon.

In one or more embodiments, the metal layer 108 comprises a transition metal, such as, for example, vanadium (V). After thermal processing 110, the silicide layer 112 comprises a TMSi, such as vanadium silicide ($V_3Si$). The coherent, epitaxial growth of transition metal silicides directly, on silicon suggests that it may be possible to achieve high-quality superconductor-silicon interfaces. The TMSi as used in a device and method according to embodiments of the invention may include known superconductors, such as, for example, $V_3Si$, A15 phases of intermetallic compounds (e.g., $M_3Si$, where M is a transition metal), $\alpha$-$ThSi_2$ disilicides (e.g., $LaSi_2$, $CaSi_2$), B31-type monosilicides (e.g., palladium silicide (PdSi), platinum silicide (PtSi), rhodium silicide (RhSi), etc.), as well as other superconductors. Some superconductors may display a relatively high superconducting transition temperature (for example, 17 K for $V_3Si$).

Figure 2:
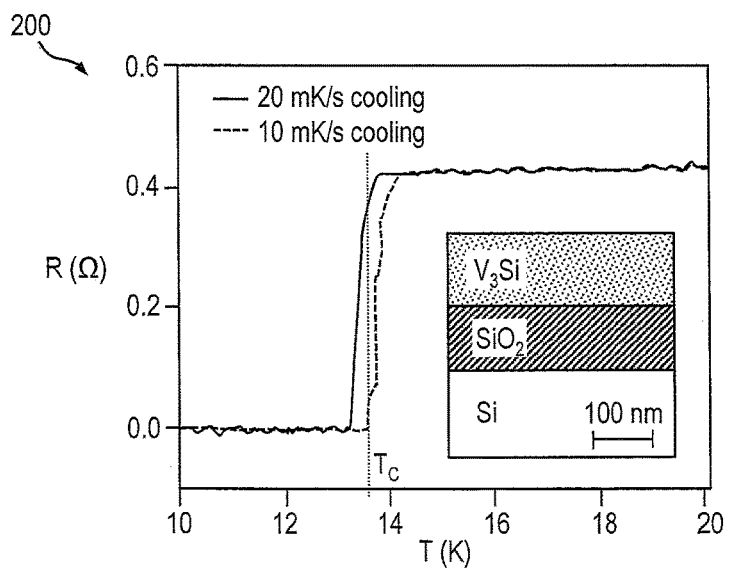
FIG. 2 is a graph depicting a plot of resistance (R), in units of ohms ($\Omega$), as a function of temperature (T), in units of degrees kelvin (K), for an exemplary film that features a clean vanadium silicide (V3Si)/silicon dioxide (SiO2) interface with a superconducting transition temperature of 14 degrees kelvin (K), for 20 millikelvin per second (mk/s) and 10 mk/s cooling rates.

The present synthesis of the superconducting phase may be demonstrated by electrical transport measurement, showing a critical superconducting transition temperature, $T_C$, of about 14 degrees kelvin (K) for a $V_3Si$ film, as shown in FIG. 2. More particularly, FIG. 2 is a graph depicting a plot of resistance (R), in units of ohms (Ω), as a function of temperature (T), in units of degrees kelvin (K), for an exemplary film that features a clean $V_3Si$/silicon dioxide ($SiO_2$) interface, for 20 millikelvin per second (mk/s) and 10 mk/s cooling rates. As apparent from FIG. 2, the $V_3Si$ film exhibits a superconducting transition temperature of about 14 K. The V3Si film has a similar but slightly lower critical temperature as its bulk phase (about 17 K).

Built upon a first part of the present synthesis of a structure including a TMSi film, an example of which was previously described in conjunction with FIG. 1, a second part according to aspects of the invention involves fabricating Josephson junctions based on transition metal silicide/ semiconductor/transition metal silicide (e.g., TMSi/silicon/ TMSi) heterojunctions. The term "heterojunction" as used herein can be broadly defined as an interface that occurs between two layers or regions of dissimilar crystalline semiconductor materials having unequal band gaps. Multiple heterojunctions can be integrated together to form a hetero structure, although the two terms are commonly used interchangeably.

According to aspects of the invention, each of two islands of TMSi may be separated by a weak link of intrinsic silicon (i-Si) or doped silicon (or another doped or undoped semiconductor material), which in one or more embodiments is about 5-500 nanometers (nm) in length, juxtaposed between the two islands (e.g., as raised regions). The weak link of intrinsic or doped silicon may form a channel between the two TMSi islands. It is to be appreciated that embodiments of the invention are not limited to any specific dimensions or types of materials used to form the TMSi islands or channel.

FIG. 3 is a perspective view depicting an exemplary structure 300 for a transition metal silicide/semiconductor/ transition metal silicide (e.g., TMSi/Si/TMSi) Josephson junction, according to an embodiment of the invention. This structure 300 can be used, for example, as a silicide-based qubit device in a quantum computing application. With reference to FIG. 3, the structure 300 includes a substrate or gate back 302, which may comprise doped silicon, an insulating layer 304, which comprises an oxide (e.g., silicon oxide, aluminum oxide, hafnium oxide, or various other possible oxides) in one or more embodiments, disposed on at least a portion of an upper surface of the substrate or gate back, and a heterojunction fabricated in accordance with aspects of the present invention, including a silicon (Si) layer 306, which may be either doped or intrinsic, sandwiched laterally between a first TMSi layer 308 and a second TMSi layer 310, the heterojunction being disposed on at least a portion of an upper surface of the insulating layer 304. In the device structure 300, the TMSi layers 308, 310 are formed in the same plane as the silicon layer 306, and therefore the transition metal silicide/semiconductor/transition metal silicide Josephson junction is configured having a vertical interface.

The insulating layer 304, in one or more embodiments, comprises an oxide material, such as, for example, silicon oxide, aluminum oxide, hafnium oxide, zirconium oxide, tantalum oxide, or various other possible oxides. Alternatively, the insulating layer 304 may comprise a high dielectric constant (high-k) material, such as, for example, oxides of tantalum, zirconium, aluminum, titanium, lanthanum, ceramics, or combinations thereof. When the substrate 302 is a gate back, the insulating layer 304 disposed on the gate back may be considered a gate oxide layer. In one or more embodiments, the insulating layer 304 has a thickness ranging from about 1 nm to 10 nm. In other embodiments, the insulating layer 304 has a thickness ranging from about 1.5 nm to 2.5 nm. It is to be understood, however, that embodiments of the invention are not limited to any specific thickness of the insulating layer 304. In one or more embodiments, the silicon layer 306 forms a channel region in the device structure 300 that may be intrinsic or it may be doped with either n-type or p-type dopants.

Similarly, the intrinsic silicon layer may be an individual layer formed separately with respect to the first and second TMSi layers, as shown in FIG. 4. Specifically, FIG. 4 is a perspective view depicting an exemplary device structure 400 for a transition metal silicide/semiconductor/transition metal silicide (e.g., TMSi/Si/TMSi) Josephson junction, according to an alternative embodiment of the invention. The device structure 400 includes a substrate or gate back 402, which may comprise doped silicon, an insulating layer 404, which, in one or more embodiments, comprises an oxide (e.g., silicon oxide, aluminum oxide, hafnium oxide, zirconium oxide, tantalum oxide, etc.) or other dielectric materials, disposed on at least a portion of an upper surface of the substrate or gate back, an intrinsic silicon or other semiconductor layer 406 disposed on at least a portion of an upper surface of the insulating layer, and a first TMSi layer 408 and a second TMSi layer 410 disposed on respective portions of an upper surface of the intrinsic silicon layer.

The first and second TMSi layers 408, 410 are spaced laterally from one another by a trench or other opening 412 through which a portion of the underlying intrinsic silicon layer 406 is exposed. In some embodiments, the opening 412 may be filled with an insulating material. In one or more embodiments, at least a portion of the silicon layer 406 forms a channel in the device structure 400. This silicon channel may be intrinsic or it may be doped with either n-type or p-type dopants. In this illustrative embodiment, the TMSi layers 408 and 410 are formed above the intrinsic silicon layer 406 (i.e., in a different plane), and the transition metal silicide/semiconductor/transition metal silicide Josephson junction is therefore configured having a horizontal interface.

Thus, each of the exemplary device structures 300 and 400 shown in FIGS. 3 and 4, respectively, a heterojunction is disposed on at least a portion of the upper surface of an insulating layer (304, 404), the heterojunction comprising a weak link layer of intrinsic or doped silicon (306, 406) and at least two TMSi regions (308/310, 408/410) coupled with the link layer. In the embodiment of FIG. 3, the TMSi regions (308, 310) are disposed on laterally opposing ends of the silicon link layer (306), so that the heterojunction has a vertical interface between the link layer and the TMSi regions. By contrast, in the embodiment of FIG. 4, the TMSi regions (408, 410) are disposed on respective portions of the upper surface of the silicon link layer (406) and spaced laterally from one another, so that the heterojunction has a horizontal interface between the link layer and the TMSi regions.

In the illustrative embodiments shown in FIGS. 3 and 4, the link layer 306 and 406, respectively, comprises intrinsic or doped silicon. However, it is to be appreciated that in one or more alternative embodiments, the link layer forming a part of the heterojunction may comprise a normal metal (e.g., in a superconductor-normal conductor-superconductor (SNS) junction) or a geometric constriction (e.g., in a superconductor-geometric constriction-superconductor (ScS) junction).

Figure 5:
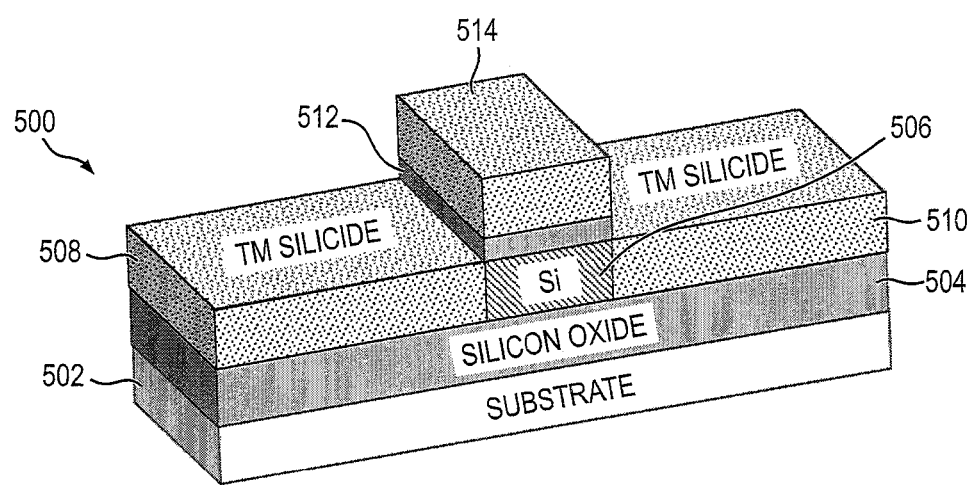
FIG. 5 is a perspective view depicting an exemplary device structure for a transition metal silicide/semiconductor/transition metal silicide Josephson junction with a top gate, according to an embodiment of the present invention.

FIG. 5 is a perspective view depicting an exemplary device structure 500 for a transition metal silicide/semiconductor/transition metal silicide Josephson junction with a top gate, according to another embodiment of the invention.

This device structure 500, like the exemplary device structures 300 and 400 illustrated in FIGS. 3 and 4, respectively, can be employed as a silicide-based qubit device in a quantum computing application. Referring to FIG. 5, the structure 500 includes a substrate 502, preferably a silicon substrate doped with either n-type or p-type dopants, an insulating layer 504, which in one or more embodiments comprises an oxide (e.g., silicon oxide, aluminum oxide, hafnium oxide, or various other possible oxides), disposed on at least a portion of an upper surface of the substrate 502, and a heterojunction fabricated in accordance with aspects of the present invention, including a silicon (Si) channel 506, which can either doped or intrinsic, residing laterally between a first TMSi layer 508 and a second TMSi layer 510, the heterojunction being disposed on at least a portion of an upper surface of the insulating layer 504. The silicon channel 506 may be intrinsic or lightly doped with either n-type or p-type dopants. In the device structure 500, the TMSi layers 508, 510 are formed in the same plane as the silicon channel 506, and therefore the transition metal silicide/semiconductor/transition metal silicide Josephson junction is configured having a vertical interface.

The TMSi layers 508, 510, like the TMSi layers 408, 410 and 308, 310 forming the exemplary device structures 400 and 300 shown in FIGS. 3 and 4, respectively, may comprise a superconductor formed as a thin film. The superconducting TMSi thin film may have certain desired thicknesses (e.g., about 10-100 nm) suitable for use in the fabrication of a Josephson junction. In one or more embodiments, a thickness of the superconducting TMSi thin film used to form the TMSi layers 508, 510 is about 20 nm, for establishing a high-quality superconductor-silicon interface. It is to be appreciated, however, that embodiments of the invention are not limited to any specific thicknesses of the TMSi layers. The superconducting TMSi thin film, in one or more embodiments, provides a lattice-matched, atomically smooth interface between superconducting TMSi layers (e.g., 508, 510) and the adjacent semiconductor material (e.g., silicon channel 506) used to faun the Josephson junction.

The device structure 500 further includes a gate dielectric layer 512, which in one or more embodiments comprises an oxide material (e.g., silicon oxide, aluminum oxide, hafnium oxide or other possible oxides), disposed on at least a portion of an upper surface of the silicon channel 506. In one or more embodiments, the gate dielectric layer 512 is formed directly on and is aligned with the underlying silicon channel 506, which can be achieved using the same photolithographic mask to form the gate dielectric layer 512 as is used to pattern the silicon channel 506. In this manner, the gate dielectric layer 512 will not extend laterally onto the upper surfaces of the TMSi layers 508, 510 forming part of the heterojunction. In one or more alternative embodiments, the gate dielectric layer 512 may extend onto the upper surfaces of the TMSi layers 508, 510.

A gate electrode 514, which may comprise metal or metal silicide material, is disposed on at least a portion of an upper surface of the gate dielectric layer 512. The gate electrode 514, in one or more embodiments, may be superconducting and may also comprise TMSi. In this instance, the TMSi material forming the gate electrode 514 may be the same as or different than that of the TMSi layers 508, 510 used to form the heterojunction. Like the gate dielectric layer 512, the dimensions of the gate electrode 514 in this illustrative embodiment are preferably aligned with the gate dielectric layer 512, so that the gate electrode 514, the gate dielectric layer 512 and the silicon channel are aligned and congruent with one another. As previously stated, in one or more alternative embodiments, the gate dielectric layer 512 and the silicon channel 506 may not be aligned with one another.

The device structure 500 is essentially a tunable quantum qubit device that integrates a Josephson tunneling junction comprising a pair of transition metal silicide superconductors (TMSi layers 508, 510) separated by an active region (silicon channel 506) having a charge density that is controllable as a function of a bias signal applied to the gate electrode 514. The gate electrode 514 forms a capacitively-coupled control gate that is connected to the Josephson tunneling junction and is configured to modulate an energy level of the tunneling junction, which in turn controls a Josephson current flowing in the device.

When used in a quantum computing circuit having a plurality of qubit devices, at least a subset of the qubit devices being formed in accordance with embodiments of the invention, the independent control gates are coupled to the Josephson tunneling junctions and are reconfigurable on-the-fly by a user. Tunability is achieved by simultaneously modulating energy levels of the Josephson tunneling junctions with the capacitive-coupled control gates and dynamically reconfiguring the quantum computing circuit via the independent control gates. This design allows for nonvolatile, field-programmable configurations where quantum states are created and reconfigured through gate-control coupling, providing increased performance, complexity, resiliency and reduced leakage.

In one or more embodiments, formation of the exemplary device structures described herein may involve deposition of certain materials and layers by physical vapor deposition (PVD), chemical vapor deposition (CVD), atomic layer deposition (ALD), molecular beam epitaxy (MBE), or any of the various modifications thereof, including, for example, plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions can be epitaxial processes, and the deposited material can be crystalline. In one or more embodiments, formation of a layer can be achieved using a single deposition process or multiple deposition processes, where, for example, a conformal layer is formed by a first process (e.g., ALD, PE-ALD, etc.) and a fill is formed by a second process (e.g., CVD, electrodeposition, PVD, etc.); the multiple deposition processes can be the same or different.

As used herein, the term "semiconductor" may refer broadly to an intrinsic semiconductor material that has been doped, that is, into which a doping agent has been introduced, giving it different electrical properties than the intrinsic semiconductor material, or it may refer to intrinsic semiconductor material that has not been doped. Doping may involve adding dopant atoms to an intrinsic semiconductor material, which thereby changes electron and hole carrier concentrations of the intrinsic semiconductor material at thermal equilibrium. Dominant carrier concentration in an extrinsic semiconductor material determines the conductivity type of the semiconductor material.

The term "metal" is intended to be used herein from a chemistry perspective to refer to the shinny, electrically conductive elements on the periodic table. This is to be distinguished from the definition of a "metal" from a physics perspective, which usually refers to those elements having a partially filled conduction band and having lower resistance toward lower temperature.

The term "gate" as used herein may refer broadly to a structure used to control output current (i.e., flow of carriers in a channel) of a semiconducting device through the application of electrical or magnetic fields.

The term "crystalline" as used herein may refer broadly to any material that is single-crystalline or multi-crystalline (i.e., polycrystalline).

The term "non-crystalline material" generally refers to any material that is not crystalline, including any material that is amorphous, nano-crystalline, or micro-crystalline.

The term "intrinsic" as used herein may refer broadly to any material which is substantially free of dopant atoms, or material in which the concentration of dopant atoms is less than a prescribed amount, such as, for example, about $10^{15}$ atoms/cm$^3$.

As used herein, the term "insulating" may generally denote a material having a room temperature conductivity of less than about $10^{-10}$ $(\Omega\text{-m})^{-1}$.

As used herein, "p-type" may refer broadly to the addition of impurities to an intrinsic semiconductor material that creates deficiencies of valence electrons. In a silicon-containing material, non-limiting examples of p-type dopants (i.e., impurities) include boron, aluminum, gallium and indium.

As used herein, "n-type" may refer broadly to the addition of impurities that contribute free electrons to an intrinsic semiconductor material. In a silicon-containing material, non-limiting examples of n-type dopants include antimony, arsenic and phosphorous.

The term "raised" as used herein may broadly define a raised region or a set of islands, for example two islands, where material is disposed only on certain surface areas of the surface of a lower layer. Typically, the raised region comprises a TMSi-containing material.

The term "gate dielectric" as used herein may refer broadly to insulating materials such as, but not limited to, silicon oxide, silicon nitride, silicon oxynitride, boron nitride, high-k materials, or any combination of these materials. Non-limiting examples of high-k materials include, for example, metal oxides, such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate, ceramics, etc. High-k materials may further include dopants such as lanthanum, aluminum, etc.

It will also be understood that when an element such as a layer, region or substrate is referred to as being "atop," "above," "on" or "over" another element, it is broadly intended that the element be in direct contact with the other element or intervening elements can also be present. In contrast, when an element is referred to as being "directly on" or "directly over" another element, it is intended that there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present. Furthermore, positional terms such as "above," "below" and "upper," are used to indicate relative positioning of elements or structures to each other as opposed to absolute position.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Any of the exemplary structures illustrated in the accompanying figures, or portions thereof, may be part of an integrated circuit. Integrated circuits so manufactured are considered part of this invention.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having silicide-based qubit devices therein (e.g., quantum computing systems) formed in accordance with one or more embodiments of the invention.

An integrated circuit in accordance with aspects of the present disclosure can be employed in essentially any application and/or electronic system involving superconducting silicide-based structures, such as, but not limited to, a qubit device, etc. Suitable systems for implementing embodiments of the invention may include, but are not limited to, quantum computing systems. Systems incorporating such integrated circuits are considered part of this invention. Given the teachings of the present disclosure provided herein, one of ordinary skill in the art will be able to contemplate other implementations and applications of embodiments of the invention.

The illustrations of embodiments of the invention described herein are intended to provide a general understanding of the various embodiments, and they are not intended to serve as a complete description of all the elements and features of apparatus and systems that might make use of the structures and semiconductor fabrication methodologies described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

The corresponding structures, materials, acts, and equivalents of all means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

The invention claimed is:

1. A qubit device for use in a quantum computing environment, the qubit device comprising:
   a semiconductor substrate;
   an insulating layer disposed on at least a portion of an upper surface of the substrate; and
   a transition metal silicide (TMSi) heterojunction disposed on at least a portion of an upper surface of the insulating layer, the TMSi heterojunction comprising a link layer and at least first and second TMSi regions coupled with the link layer.

2. The device of claim 1, wherein the first and second TMSi regions and the link layer in the heterojunction are disposed on the upper surface of the insulating layer, and the first and second TMSi regions are disposed on laterally opposing ends of the link layer, such that the heterojunction is configured having vertical interfaces between the link layer and the first and second TMSi regions.

3. The device of claim 2, wherein the link layer and the first and second TMSi regions collectively align and form a congruent layer disposed on the upper surface of the insulating layer.

4. The device of claim 1, wherein the first and second TMSi regions are disposed on an upper surface of corresponding portions of the link layer in the heterojunction, and the first and second TMSi regions are spaced laterally from one another by an opening formed therebetween, such that the heterojunction is configured having horizontal interfaces between the link layer and the first and second TMSi regions.

5. The device of claim 1, wherein the link layer is a weak link layer comprising at least one of intrinsic and doped silicon.

6. The device of claim 1, wherein the heterojunction comprises a vertical interface between the link layer and the first and second TMSi regions, the insulating layer is a gate oxide layer, the first and second TMSi regions are disposed on at least a portion of the upper of the gate oxide layer, and the link layer is a weak link layer comprising intrinsic or doped silicon which forms at least a portion of a channel disposed between the first and second TMSi regions.

7. The device of claim 1, wherein each of the first and second TMSi regions in the heterojunction comprises a superconducting TMSi and the link layer comprises a superconducting silicon semiconductor.

8. The device of claim 1, wherein an interface between the link layer and the first and second TMSi regions in the heterojunction is lattice-matched.

9. The device of claim 1, wherein an interface between the link layer and the first and second TMSi regions in the heterojunction is atomically smooth.

10. The device of claim 1, wherein the link layer forms at least a portion of a channel comprising intrinsic or doped silicon, the device further comprising:
    a gate dielectric layer disposed on a portion of an upper surface of the heterojunction between the first and second TMSi regions and above the channel; and
    a gate electrode disposed on an upper surface of the gate dielectric layer.

11. The device of claim 1, wherein the link layer comprises one of a normal conductor, thereby forming a superconductor-normal conductor-superconductor (SNS) junction, and a geometric constriction, thereby forming a superconductor-geometric constriction-superconductor (ScS) junction.

12. The device of claim 1, wherein the link layer comprises at least one of intrinsic silicon and doped silicon.

13. A method of forming a qubit structure for use in a quantum computing environment, the method comprising:
    forming an insulating layer on at least a portion of an upper surface of a semiconductor substrate; and
    forming a transition metal silicide (TMSi) heterojunction on at least a portion of an upper surface of the insulating layer, the TMSi heterojunction comprising a link layer and at least first and second TMSi regions coupled with the link layer.

14. The method of claim 13, wherein forming the TMSi heterojunction comprises:
    fainting a silicon layer on a portion of the upper surface of the insulating layer, the silicon layer serving as the link layer of the TMSi heterojunction; and
    forming the first and second TMSi regions on respective portions of the upper surface of the insulating layer, first and second TMSi regions being disposed on laterally opposing ends of the silicon layer, such that the heterojunction is configured having vertical interfaces between the link layer and the first and second TMSi regions.

15. The method of claim 14, wherein the first and second TMSi regions and the silicon layer are formed in a same plane on the upper surface of the insulating layer.

16. The method of claim 13, wherein the link layer and the first and second TMSi regions collectively align and form a congruent layer disposed on the upper surface of the insulating layer.

17. The method of claim 13, wherein forming the TMSi heterojunction comprises:
  forming a silicon layer on the upper surface of the insulating layer, the silicon layer serving as the link layer of the TMSi heterojunction;
  forming a TMSi layer on an upper surface of the silicon layer; and
  forming a trench through the TMSi layer through which a portion of the underlying silicon layer is exposed, the trench dissecting the TMSi layer so as to form the first and second TMSi regions spaced laterally from one another by the trench, such that the TMSi heterojunction is configured having horizontal interfaces between the silicon layer and the first and second TMSi regions.

18. The method of claim 17, further comprising filling the trench with an insulating material.

19. The method of claim 13, wherein each of the first and second TMSi regions in the heterojunction comprises a superconducting TMSi and the link layer comprises a superconducting silicon semiconductor.

20. The method of claim 13, wherein the link layer forms at least a portion of a channel comprising intrinsic or doped silicon, the method further comprising:
  forming a gate dielectric layer on a portion of an upper surface of the heterojunction between the first and second TMSi regions and above the channel; and
  forming a gate electrode on an upper surface of the gate dielectric layer.

* * * * *